United States Patent
Bruce

Patent Number: 6,042,878
Date of Patent: *Mar. 28, 2000

[54] METHOD FOR DEPOSITING A CERAMIC COATING

[75] Inventor: Robert W. Bruce, Loveland, Ohio

[73] Assignee: General Electric Company, Cincinnati, Ohio

[*] Notice: This patent issued on a continued prosecution application filed under 37 CFR 1.53(d), and is subject to the twenty year patent term provisions of 35 U.S.C. 154(a)(2).

[21] Appl. No.: 08/775,698

[22] Filed: Dec. 31, 1996

[51] Int. Cl.[7] .................................... C23C 14/24
[52] U.S. Cl. .................... 427/126.2; 427/126.3; 427/255.36; 427/566
[58] Field of Search .............. 427/248.1, 126.2, 427/126.3, 255.36, 566; 204/192.1

[56] References Cited

U.S. PATENT DOCUMENTS

| | | |
|---|---|---|
| 3,434,863 | 3/1969 | Hansen et al. . |
| 3,854,984 | 12/1974 | Schadler et al. . |
| 4,414,249 | 11/1983 | Ulion et al. ........................ 427/248.1 |
| 4,676,994 | 6/1987 | Demaray . |
| 4,880,614 | 11/1989 | Strangman ...................... 427/248.1 |
| 5,015,502 | 5/1991 | Strangman ........................ 427/250 |
| 5,236,151 | 8/1993 | Hagle et al. . |
| 5,236,745 | 8/1993 | Gupta et al. . |
| 5,238,752 | 8/1993 | Duderstadt et al. . |
| 5,254,413 | 10/1993 | Maricocchi . |
| 5,281,487 | 1/1994 | Rumaner et al. . |
| 5,316,866 | 5/1994 | Goldman et al. . |
| 5,350,599 | 9/1994 | Rigney et al. ..................... 427/255.7 |
| 5,418,003 | 5/1995 | Bruce et al. ........................ 427/566 |
| 5,514,482 | 5/1996 | Strangman ...................... 427/383.7 |
| 5,538,796 | 7/1996 | Schaffer et al. .................. 427/532 |
| 5,556,713 | 9/1996 | Leverant ........................... 427/531 |
| 5,683,761 | 11/1997 | Bruce et al. ..................... 427/419.2 |
| 5,683,825 | 11/1997 | Bruce et al. ....................... 427/249 |

*Primary Examiner*—Shrive Beck
*Assistant Examiner*—Bret Chen
*Attorney, Agent, or Firm*—Andrew C. Hess; David L. Narcisco

[57] ABSTRACT

A method is provided for physical vapor deposition of ceramic thermal barrier coatings and articles made therefrom. Impurity levels in conventional yttria stabilized zirconia source materials have caused undesired spitting (eruptions) due to a combined effect of various impurities thereby requiring relatively low evaporation rates to control the level of spitting during the process. The present method provides a high purity source material having a purity index sufficiently low to result in reduced spitting in the vapor deposition process and to permit increased evaporation rates. Reducing the density of the source material has also been found to reduce spitting. The method permits higher processing rates and/or reduced levels of spitting.

15 Claims, 2 Drawing Sheets

METHOD FOR DEPOSITING A CERAMIC COATING

BACKGROUND OF THE INVENTION

1. Field of the Invention

The present invention relates to physical vapor deposition methods and articles therefrom, and more particularly relates to ceramic vapor deposition methods and articles made therefrom.

2. Description of the Related Art

In the gas turbine engine art, particularly those developed for use in aircraft, high temperature operating components are exposed to strenuous oxidizing conditions during operation. Typical of such components are the blades, vanes and associated parts disposed in the turbine section of such engines. In order to extend the operating life of such articles, designers have specified coatings for application to article surfaces for oxidation as well as sulfidation protection.

One such coating has been reported as a thermal barrier coating system in a variety of forms. Generally, the thermal barrier coating is a ceramic type coating, examples of which include zirconia generally stabilized with yttria magnesia or calcia. A preferred form of such a system includes a bond coating disposed between the substrate and the ceramic thermal barrier coating. Reported have been bond coatings of the M Cr Al type of alloy in which M is a metal selected from Fe, Ni, Co and their mixtures and alloys. Other elements including Y, rare earths, Pt, Rh, Pd, and Hf, and their combinations have been included in such an M Cr Al alloy to enhance selected properties. Typical U.S. patents describing such a system or elements thereof include U.S. Pat. No. 4,055,705 Stecura, et al issued Oct. 25, 1977; U.S. Pat. No. 4,269,903 Clingman, et al issued May 26, 1981; U.S. Pat. No. 4,321,310 Ulion, et al issued Mar. 23, 1982; U.S. Pat. No. 4,321,311 Strangman issued Mar. 23, 1981; U.S. Pat. No. 4,335,190 Bill, et al issued Jun. 15, 1982; and U.S. Pat. No. 4,880,614 Strangman issued Nov. 14, 1989, all of which are incorporated herein by reference. Other bond coat systems such as aluminides and platinum modified aluminides are suitable. Bruce, et al U.S. Pat. No. 5,418,003 issued May 23, 1995 is incorporated herein by reference, and discloses vapor deposition of ceramic materials involving (a) furnishing an ingot of a ceramic material, (b) treating the ingot to reduce sources of gas within the ingot, and (c) evaporating the ceramic material in the ingot by melting the surface of the ingot with an intense heat source; the evaporated ceramic is then deposited upon a substrate as the ceramic coating. Bruce discloses that the reduced gas content of the ingot decreases the incidence of spitting and eruptions from the molten surface of the ingot, thereby improving the quality of the deposited coating and faciling increases in evaporation rates and coating process production rates. The gas can be trapped in closed pore voids, on surfaces and in cracks in the source material.

While the above coating techniques can provide thermal barrier coatings, these processes, depending upon the materials being used, can suffer from one or more of the following problems (a) raw material impurities, (b) relatively expensive high purity raw materials, (c) relatively slow production rates and/or (d) undesirably high levels of material spitting (eruptions). Low melting point impurities are another source of gas/vapor that causes spitting and eruptions.

Consequently, there is a desire to provide a process (method) for producing thermal barrier coated articles wherein the process allows for the use of cost effective impurity levels, relatively high production rates and relatively low levels of spitting during the deposition process.

SUMMARY OF THE INVENTION

A method is provided for physical vapor deposition of ceramic thermal barrier coatings and articles made therefrom. Impurity levels in conventional yttria stabilized zirconia source materials have caused undesired spitting (eruptions) due to a combined effect of various impurities thereby requiring relatively low evaporation rates to control the level of spitting during the process. The present method provides a high purity source material having a purity index sufficiently low to result in reduced spitting in the vapor deposition process and to permit increased evaporation rates. Reducing the density of the source material has also been found to reduce spitting. The method permits higher processing rates and/or reduced levels of spitting.

DETAILED DESCRIPTION OF THE INVENTION

Figure 1:
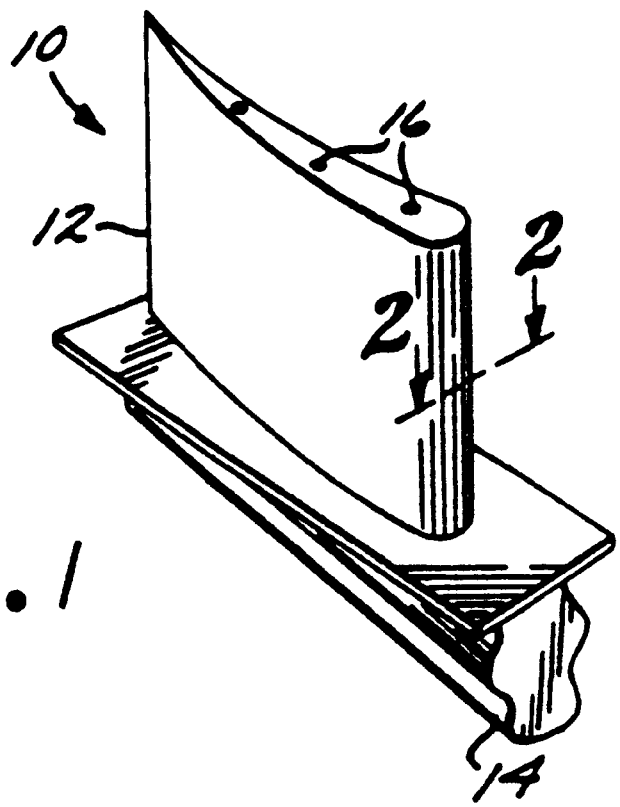
FIG. 1 is a perspective view of a turbine blade having a metallic protective coating.

The coating process of the present invention involves the use of an yttria stabilized zirconia source material having a low impurity index. Benefication processes to reduce the impurity index include, but are not limited to, washing, filtration, cyclone or gravity separation, calcination, leaching, magnetic separation, floatation, anion exchange, plasma desilication, liquid-liquid counter current extraction and skull melting processes. The coating is preferably applied as an overlay coating to a substrate to form a desired coated article. One such article is a coated jet engine gas turbine blade 10 as illustrated in FIG. 1. The substrate of the blade 10 may be formed of any suitable alloy, including superalloys. One example of such a superalloy is RENE 80, a well known nickel-base superalloy which has a nominal composition, in weight percent, of 14 percent chromium, 9.5 percent cobalt, 5 percent titanium, 4 percent tungsten, 4 percent molybdenum, 3 percent aluminum, 0.17 percent carbon 0.06 percent zirconium, 0.015 percent boron, and the balance nickel Another example is a more advanced nickel-base superalloy such as RENE N4, having a nominal composition, in weight percent of 7.5 cobalt, 9.0 chromium, 3.7 aluminum, 4.2 titanium, 1.5 percent molybdenum, 4.0 percent tantalum, 6.0 percent tungsten, 0.5 percent niobium, and balance nickel. These substrate superalloys are presented as examples, and the coatings and processes are not limited for use with these substrates.

Figure 2:
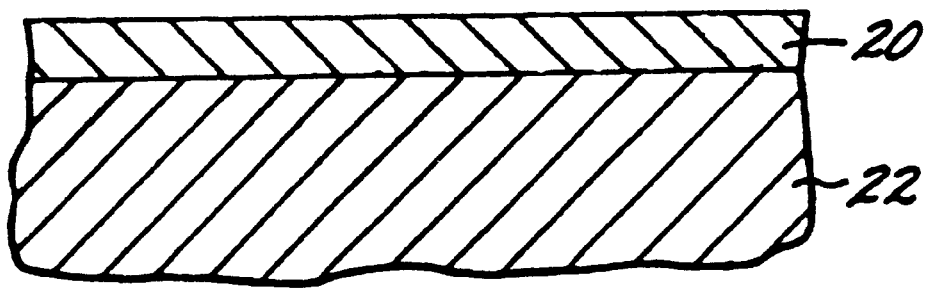
FIG. 2 is an enlarged sectional view of the turbine blade of FIG. 1 taken along lines 2—2.
Figure 3:
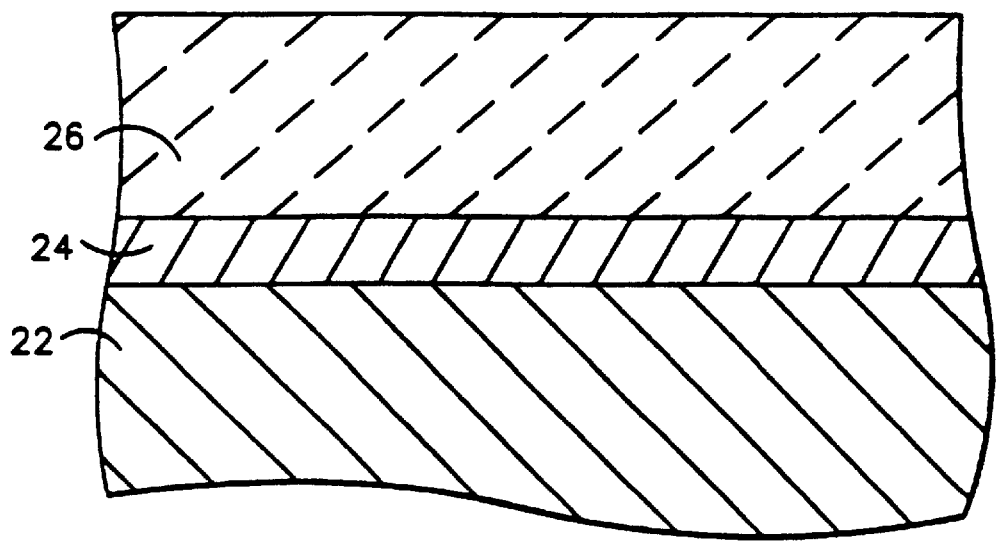
FIG. 3 is a sectional view similar to that of FIG. 2, with a thermal barrier coating overlying the metallic coating.

As shown in FIGS. 1, 2, and 3 the blade (10) has various layers. Such a blade (10) includes an airfoil section (12) against which hot combustion gases are directed when the engine operates, and whose surface is subjected to severe oxidation and corrosion attack during service. If the surface of the airfoil section (12) is not protected against oxidation and corrosion in some fashion, it will last at most only a few cycles of operation. The airfoil section (12) is anchored to a turbine disk (not shown) through a root section (14). In some cases, cooling passages (16) are present in the airfoil section (12), through which cool bleed air is forced to remove heat from the blade (10). The blade (10) is normally prepared by a casting and solidification procedure well know to those skilled in the art, such as investment casting or, more preferably, directional solidification or single crystal growth.

The airfoil section (12) is protected by a metallic protective coating (20), as illustrated in detail in FIG. 2, which depicts an enlargement of a section through the surface portion of the blade (10). The (nickel-base) superalloy of the blade (10) forms a substrate (22) upon which and over which the coating (20) is deposited. A ceramic thermal barrier coating (26) is applied overlying the bond coating (24). The yttria stabilized zirconia source material used for the deposition process is preferably in the form of an ingot. The number of spits found on coated parts correlates with the spit (eruption) count in the pool and ingot quality is the leading cause of spitting and eruptions. A six-fold reduction in spitting caused by ingot allows for a two-fold increase in evaporation rate with the same level of spits on parts. Vacuum heat treating a high purity ingot can further improve the purity of the ingot. For example vacuum heat treating the ingot to 1832° F., (about 1000° C.) at ramp rates from 5° F./minute to 10° F./minute (about 2.8° C./minute to about 5.6° C./minute) shows three to six-fold improvements over nonheat treated ingots. Lower firing temperatures of the ingot, leading to lower density of the ingot, have been shown to reduce spitting. Spitting and eruptions, the most severe form of spitting, causes spits (a mass of ceramic material) to form in the coating, which can then separate from the surface during cyclic thermal exposure, leaving pits that can lead to spallation due to thermal and oxidative exposure of the bond coat, and these pits can also lead to increased erosion of the thermal barrier coating. Undesired levels of spitting and eruptions cause control problems during the evaporation process, limiting the evaporation rate. The present process which uses a reduced spitting ingot permits increased evaporation and coating rates. Alternatively, the present process may use pellets or powder as the starting material (source material).

The source material of the present process has a relatively low impurity index, preferably less than 7000, more preferably less than 6200, and most preferably less than 5000. The impurity index is a measure of impurity taking into account a weighted factoring of impurity levels based on their spitting tendency. The impurity index is calculated for yttria stabilized zirconia as follows: 8×Ca (typically in the form of CaO)+7×C+7×Fe (typically in the form of $Fe_2O_3$)+7×Si (typically in the form of $SiO_2$)+7×Ti (typically in the form of $TiO_2$)+7×S+5×Mg (typically in the form of MgO)+5×Na (typically in the form of $Na_2O$)+4×Bi (typically in the form of $Bi_2O_3$)+3×Al (typically in the form of $Al_2O_3$)+2×P (typically in the form of $P_2O_5$)+2×Ta (typically in the form of $Ta_2O_5$) wherein the amounts of the various impurities (elements) is based on the total weight of the source material. The correlation between the impurity index and the spitting appears to be relatively linear. Yttrium and hafnium levels should also be controlled to minimize spitting.

The source material (ingot) preferably also has a reduced density level to improve production rates and reduce spitting and eruptions. Conventional ingot densities have run from 3.6 grams per cubic centimeter (g/cc) to 4.0 g/cc. According to this invention, suitable densities are less than 3.6 g/cc, preferably not greater than 3.5 g/cc, and more preferably not greater than 3.2 g/cc. An example of a suitable range is 3.2 to 3.5 g/cc. Lower maximum firing temperature is one way of obtaining lower density. The structures may contain or be free of other layers, and the materials may contain or be free of various compounds. The following examples are not meant to limit the scope of the present invention.

EXAMPLES

A first conventional purity yttria stabilized zirconia (ICA) has the following ppm of impurities: C(210 ppm), Na(35 ppm), Mg(27 ppm), Al(64 ppm), Si(68 ppm), P(66 ppm), S(32 ppm), Ca(57 ppm), Ti(510 ppm), Fe(43 ppm), Ta(760 ppm), Bi(0.13 ppm) providing an impurity index of 7×210+5×35+5×27+3×64+7×68+2×66+7×32+8×57+7×510+7×43+2×760+4×0.13=8651, and yield a high level of spitting during vapor deposition thereby effectively limiting the vapor deposition rate.

A higher purity ingot (IC1) (based on the impurity index) was obtained by combining high purity initial ingot composition with further heat treatment to remove volatiles. The combined effect of improving purity with regard to volatiles and nonvolatiles yielded a source material having C(140 ppm), Na(12 ppm), Mg(13 ppm), Al(52 ppm), Si(45 ppm), P(40 ppm), S(39 ppm), Ca(61 ppm), Ti(510 ppm), Fe(13 ppm), Ta(21 ppm) and Bi(0.048 ppm) yielding an impurity index of 6129.

An even higher purity ingot (IC2) was obtained and heat treated to yield a source material having a low impurity index. The source material had the following elemental impurity levels C(77 ppm), Na(20 ppm), Mg(9 ppm), Al(58 ppm), Si(32 ppm), P(39 ppm), S(15 ppm), Ca(54 ppm), Ti(450 ppm), Fe(9 ppm), Ta(12 ppm) and Bi(0.087 ppm) yielding an impurity index of 4938.

The spitting level of ICA was approximately 50% greater than that of IC1 and was approximately 4 times as great as IC2. In other words the present process involving utilization of a low impurity index source material results in reduced spitting and permits enhanced production rates.

This invention has been described in connection with specific embodiments and examples. However, it will be readily recognized by those skilled in the art the various modifications and variations of which the present invention is capable without departing from its scope as defined by the appended claims.

What is claimed is:

1. A method for coating an article substrate with a thermal barrier coating, said method comprising the steps of:

providing a source of material of yttria stabilized zirconia having an impurity index of less than 7000, said impurity index being determined by the formula impurity index=8×Ca+7×C+7×Fe+7×Si+7×Ti+7×S+5×Mg+5×Na+4×Bi+3×Al+2×P+2×Ta wherein elemental values are in parts per million by weight based on the total weight of source material, firing said source material at a sufficiently low temperature to yield a density of not greater than 3.5 g/cc, and vapor depositing said source material to form a coating on a substrate.

2. The method of claim 1 wherein said method further comprises applying a bond coat to said substrate prior to said vapor depositing.

3. The method of claim 1 wherein said source material has a carbon level of no greater than 0.05 percent by weight based on the total weight of the source material.

4. The method of claim 1 wherein said source material has an iron level of no greater than 0.06 percent by weight based on the total weight of the source material.

5. The method of claim 1 wherein said source material has a magnesium level of no greater than 0.05 percent by weight based on the total weight of the source material.

6. The method of claim 1 wherein said source material has a density of not greater than 3.2 g/cc.

7. The method of claim 1 wherein said source material has a calcium level of no greater than 0.05 percent by weight based on the total weight of the source material.

8. The method of claim 1 wherein said source material has a silicon level of no greater than 0.05 percent by weight based on the total weight of the source material.

9. The method of claim 1 wherein said source material has a titanium level of no greater than 0.01 percent by weight based on the total weight of the source material.

10. The method of claim 1 wherein said source material has a sodium level of no greater than 0.05 percent by weight based on the total weight of the source material.

11. The method of claim 1 wherein said source material has a bismuth level of no greater than 0.0003 percent by weight based on the total weight of the source material.

12. The method of claim 1 wherein said source material has a sulfur level of no greater than 0.02 percent by weight based on the total weight of the source material.

13. A method for coating an article substrate with a thermal barrier coating, said method comprising the steps of:
   providing a source of material of yttria stabilized zirconia,
   firing said source material at a sufficiently low temperature to yield a density of not greater than 3.5 g/cc, and
   vapor depositing said source material to form a coating on a substrate.

14. The method of claim 13 wherein said source material has a density of not greater than 3.2 g/cc.

15. The method of claim 14 wherein said source material is in the form of an ingot.

* * * * *